(12) United States Patent  (10) Patent No.: US 7,683,892 B2
Chung et al.  (45) Date of Patent: *Mar. 23, 2010

(54) TOUCH SENSING APPARATUS USING VARYING SIGNAL DELAY INPUT TO A FLIP-FLOP

(75) Inventors: Shin-Hong Chung, Guangdong (CN); Han-Che Wang, Guangdong (CN); Kuan-Hong Hsieh, Guangdong (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 700 days.

This patent is subject to a terminal disclaimer.

(21) Appl. No.: 11/557,958

(22) Filed: Nov. 8, 2006

(65) Prior Publication Data

US 2007/0124632 A1  May 31, 2007

(30) Foreign Application Priority Data

Nov. 10, 2005  (CN) .......................... 2005 1 0101252

(51) Int. Cl.
*G06F 3/041* (2006.01)
(52) U.S. Cl. ................. 345/173; 178/18.01; 178/18.02; 200/600; 324/415
(58) Field of Classification Search ... 178/18.01–18.07, 178/20.01–20.04, 19.01–19.07; 345/173; 200/600; 324/663, 415
See application file for complete search history.

(56) References Cited

U.S. PATENT DOCUMENTS

| 4,081,700 | A | * | 3/1978 | Hamilton, II | ............... | 307/116 |
| 4,331,890 | A | * | 5/1982 | Makino et al. | ............... | 307/326 |
| 5,495,077 | A | | 2/1996 | Miller et al. | | |
| 5,790,107 | A | * | 8/1998 | Kasser et al. | ................ | 345/174 |
| 5,943,516 | A | * | 8/1999 | Uchiyama et al. | ........... | 396/281 |
| 6,534,970 | B1 | | 3/2003 | Ely et al. | | |
| 6,545,614 | B1 | | 4/2003 | Kasai | | |
| 6,885,365 | B1 | * | 4/2005 | Kang | .......................... | 345/173 |
| 2006/0007181 | A1 | * | 1/2006 | Jung et al. | ................... | 345/173 |

* cited by examiner

*Primary Examiner*—Amare Mengistu
*Assistant Examiner*—Gene W Lee
(74) *Attorney, Agent, or Firm*—Winston Hsu

(57) ABSTRACT

A touch sensing apparatus is provided. The apparatus includes a sensor (13), a flip-flop (16), and a microcontroller unit (17). The sensor is connected to one of input of the flip-flop for receiving electricity signals from an object that touches the sensor. The MCU respectively supplies two AC signals at two outputs thereof to two inputs of the flip-flop. The flip-flop outputs a first type output signal at the output thereof when the sensor not being touched. When being touched, the sensor receives electricity signals from an object, and causes a delay of an AC signal to be inputted to the input of the flip-flop to which the sensor is connected, the delay of the AC signal to be inputted to the input of the flip-flop further causes the flip-flop to output a second type output signal at a output thereof. The MCU detects a change of the output signals of the flip-flop from the first type output signal to the second type output signal and accordingly identifies a touch on the sensor.

7 Claims, 4 Drawing Sheets

TOUCH SENSING APPARATUS USING VARYING SIGNAL DELAY INPUT TO A FLIP-FLOP

BACKGROUND OF THE INVENTION

1. Field of the Invention

The present invention relates generally to touch sensing apparatuses, and particularly to a touch sensing apparatus for sensing electricity signals of an object.

2. Description of Related Art

There are several available types of touch-sensing apparatuses that may be employed for use as positional indicators in apparatus such as personal computers. Among them, resistive-membrane positioning sensors and capacitive positioning sensors are well known and typically used in several applications. However, the resistive-membrane positioning sensors generally have poor resolutions. In addition, surfaces of the resistive-membrane positioning sensors are often exposed in air, and therefore are easily worn out. Furthermore, resistive-membrane positioning sensors are relatively expensive.

A capacitive positioning sensor typically includes a substrate which supports a first and second interleaved, closely spaced, non-overlapping arrays of conductive plates. An insulating layer overlies the first and second arrays. When an outer surface of the insulating layer is touched, the capacitances of at least one of the columns of plates of the first array and one of the rows of plates of the second array underlying the insulating layer at a location being touched exhibits a change with respect to ambient ground. Based upon the measured capacitance of each column of the first array and row of the second array, a microcomputer produces output signals representing the coordinates of the location being touched. These output signals can be used, for example, to control a position of a cursor on a display screen of a personal computer or to make a selected function command. Although the capacitive positioning sensor has been designed to avoid being exposed in air and thereby to avoid being easily worn out, however, by overlying the insulating layer thereon, the sensitivity of the touch sensing apparatus is reduced.

What is still needed is a touch sensing apparatus with reduced circuitry complexity, improved sense sensitivity, improved efficiency, and lower manufacturing costs.

SUMMARY OF THE INVENTION

A touch sensing apparatus is provided. A preferred embodiment of a touch sensing apparatus includes a sensor, an integration circuit, a resistor, a flip-flop, and a microcontroller unit (MCU). The flip-flop has a first input and a second input and an output. The sensor is connected to the first input of the flip-flop and for receiving electricity signals from an object that touches the sensor. The MCU has an input, a first output, and a second output. The input is for receiving and providing output signals of the flip-flop to the MCU to identify a touch on the sensor according to the output signals of the flip-flop. The first output is for outputting a first AC signal to the first input of the flip-flop, and the second output is for outputting a second AC signal to the second input of the flip-flop. The integration circuit interposes between the second input of the flip-flop and the second output of the MCU and is for delaying the AC signal to be inputted to the second input of the flip-flop. The resistor interposed between the first input of the flip-flop and the first output of the MCU. When the sensor not being touched, the flip-flop outputs a first type output signal at the output thereof, while when the sensor being touched, the sensor receives electricity signals from the object, and causes a delay of the AC signal to be inputted to the first input of the flip-flop, the delay of the AC signal to be inputted to the first input of the flip-flop further causing the flip-flop to output a second type output signal at the output thereof. The MCU detects an output change of the output signals of the flip-flop from the first type output signal to the second type output signal and accordingly identifies a touch on the sensor.

Other advantages and novel features will be drawn from the following detailed description of the preferred embodiment with reference to the attached drawings, in which:

DETAILED DESCRIPTION OF THE INVENTION

Figure 1:
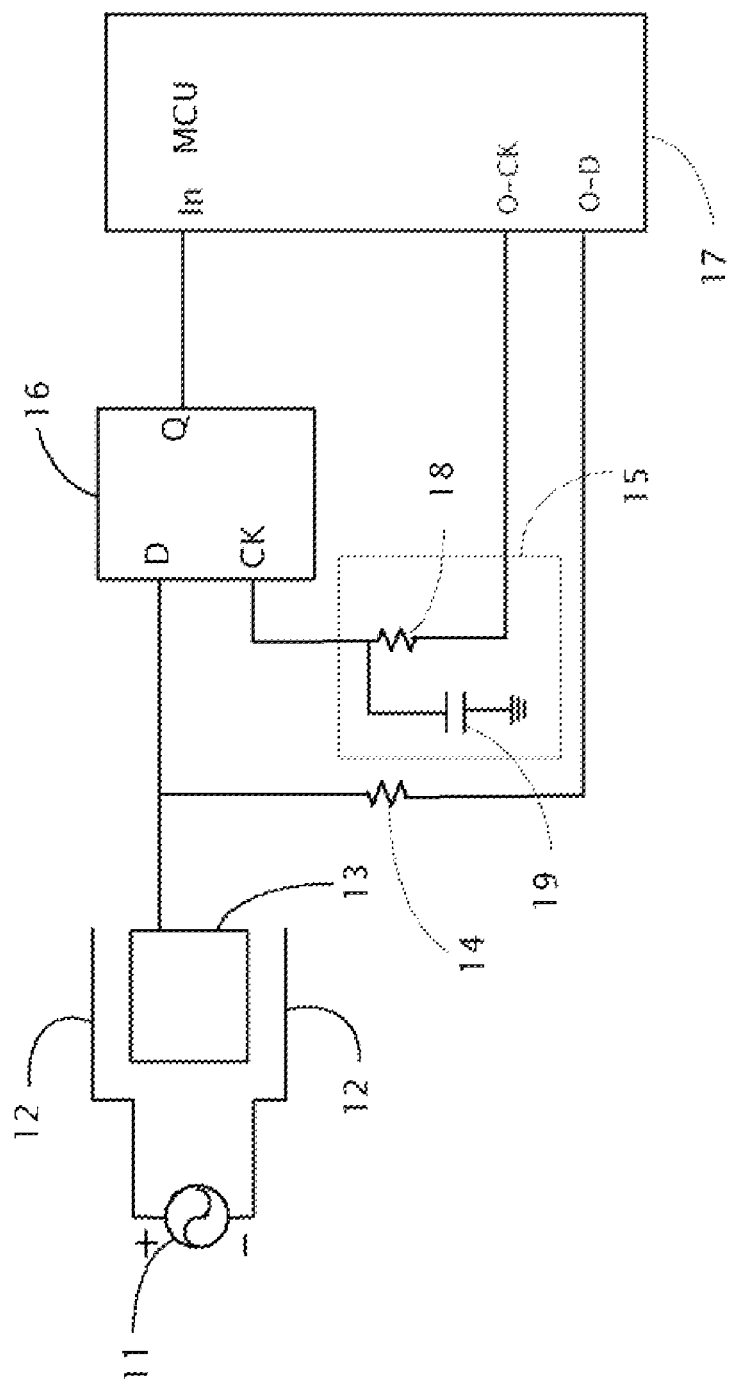
FIG. 1 is an exemplary circuit diagram of a touch sensing apparatus in accordance with a first preferred embodiment of the present invention.

FIG. 1 is an exemplary circuit diagram of a touch sensing apparatus in accordance with a first preferred embodiment of the present invention. The apparatus mainly includes a differential signal source 11, two conductors 12, a sensor 13, a resistor 14, a first integration circuit 15, a D-type flip-flop 16, and a microcontroller unit (MCU) 17.

The D-type flip-flop 16 includes a data signal input D (hereinafter "the input D"), a clock signal input CK (hereinafter "the input CK"), and an output Q. The differential signal source 11 has a positive output and a negative output, each connecting to the conductors 12 correspondingly. The sensor 13 is located between the conductors 12, and forms two parallel-arranged capacitors with the conductors 12. The sensor 13 is connected to the input D of the D-type flip-flop 16.

The differential signal source 11 outputs a positive signal and a negative signal via the positive output and the negative output thereof respectively. Generally, environmental noises can be generated in an environment with charged bodies such as electric lights and computers. The environmental noises are AC signals with irregular waveforms. When the environmental noises reach the parallel-arranged capacitors, positive half-waves and negative half-waves of the environmental noises are offset respectively by the positive signal and the negative signal outputted by the differential signal source 11. The touch sensing apparatus is therefore protected from being disturbed by the environmental noises and improves a sensitivity thereof.

The MCU 17 includes a clock signal output O-CK (hereafter "output O-CK"), a data signal output O-D (hereafter "output O-D"), and an input In. The output O-Ck and O-D are connected and applied AC signals to the first integration circuit 15 and the first resistor 14 respectively. The AC signals outputted from the outputs O-CK and O-D have the same frequency and each has a plurality of rising edges and falling edges. The rising edges and/or the falling edges of the AC signal outputted from the output O-D are at a predetermined time ahead of the rising edges of the AC signal outputted from the output O-CK correspondingly. For simplicity, this embodiment only illustrates a case when the rising edge of the AC signal outputted from the output O-D is ahead of the rising edge of the AC signal outputted from the output O-CK as an example.

The first integration circuit 15 is connected to the input CK of the D-type flip-flop 16, and delays an active transition time between a high level (hereinafter simplified as "H") and a low level (hereinafter simplified as "L") of the AC signal to be inputted to the input CK. Specifically, the first integration circuit 15 prolongs the active transition time of the AC signal to be inputted to the input CK. For simplicity, the AC signal delivered by the first integration circuit 15 to the input CK is hereinafter referred to as a CK signal. The first resistor 14 is connected to the input D of the D-type flip-flop 16, and constitutes a second integration circuit with the sensor 13. The second integration circuit prolongs the active transition time between the H and the L of the AC signal to be inputted to the input D. Specifically, the second integration circuit prolongs the active transition time of the AC signal to be inputted to the input D. To clarify, the AC signal delivered by the second integration circuit to the input D is hereinafter referred to as a D signal. The output Q of the D-type flip-flop 16 is connected to the input In of the MCU 17.

The first integration circuit 15 comprises a second resistor 18 and a capacitor 19. Specifically, the second resistor 18 is interposed between the O-Ck output of the MCU 17 and the input CK of the D-type flip-flop 16, while the capacitor 19 is interposed between the ground and the input CK of the D-type flip-flop 16. However, broadly speaking, according to a principle of the present invention, the components of the first integration circuit 15 and the resistor 14 are chosen and arranged to achieve a goal that: when the sensor 13 is not touched, positive going times both of the CK signal and the D signal are respectively prolonged by the first integration circuit 15 and the second integration circuit, a transition point on each rising edge of the D signal is at a predetermined time ahead of an active trigger point on the rising edges of the CK signal correspondingly. Hence, at the active trigger point, the D-type flip-flop 16 is triggered to output a first type output signal at the output Q thereof. More specifically in this example, the D-type flip-flop 16 outputs an L signal at the active trigger points.

Generally, charged bodies can create alternating magnetic fields around themselves. When an electrical conducting object such as a human body moves into such an alternating magnetic field, inductive charges are generated and distributed on surfaces of the electrical conducting object, thus, improving electricity signals of the electrical conducting object. In the preferred embodiment, the differential signal source 11 provides such an alternating magnetic field improving the electricity signals of the electrical conducting object that touches the sensor 13.

The sensor 13 and the ground form a distributed capacitor. When the electrical conducting object touches the sensor 13, the inductive charges on the electrical conducting object flows to the sensor 13, thus causing a capacitance change of the distributed capacitor, further causing a capacitance change of the second integration circuit. The second integration circuit further prolongs the active transition time of the D signal. The transition point on the rising edge of the D signal falls behind the corresponding active trigger point of the D-type flip-flop 16, and causes the D-type flip-flop 16 to output a second type output signal at the active trigger points. More specifically in this example, the D-type flip-flop 16 is triggered to output an H signal at the active trigger points. The MCU 17 detects an output change of the D-type flip-flop 16, accordingly identifies a touch on the sensor 13 and then performs a predetermined operation.

Figure 2:
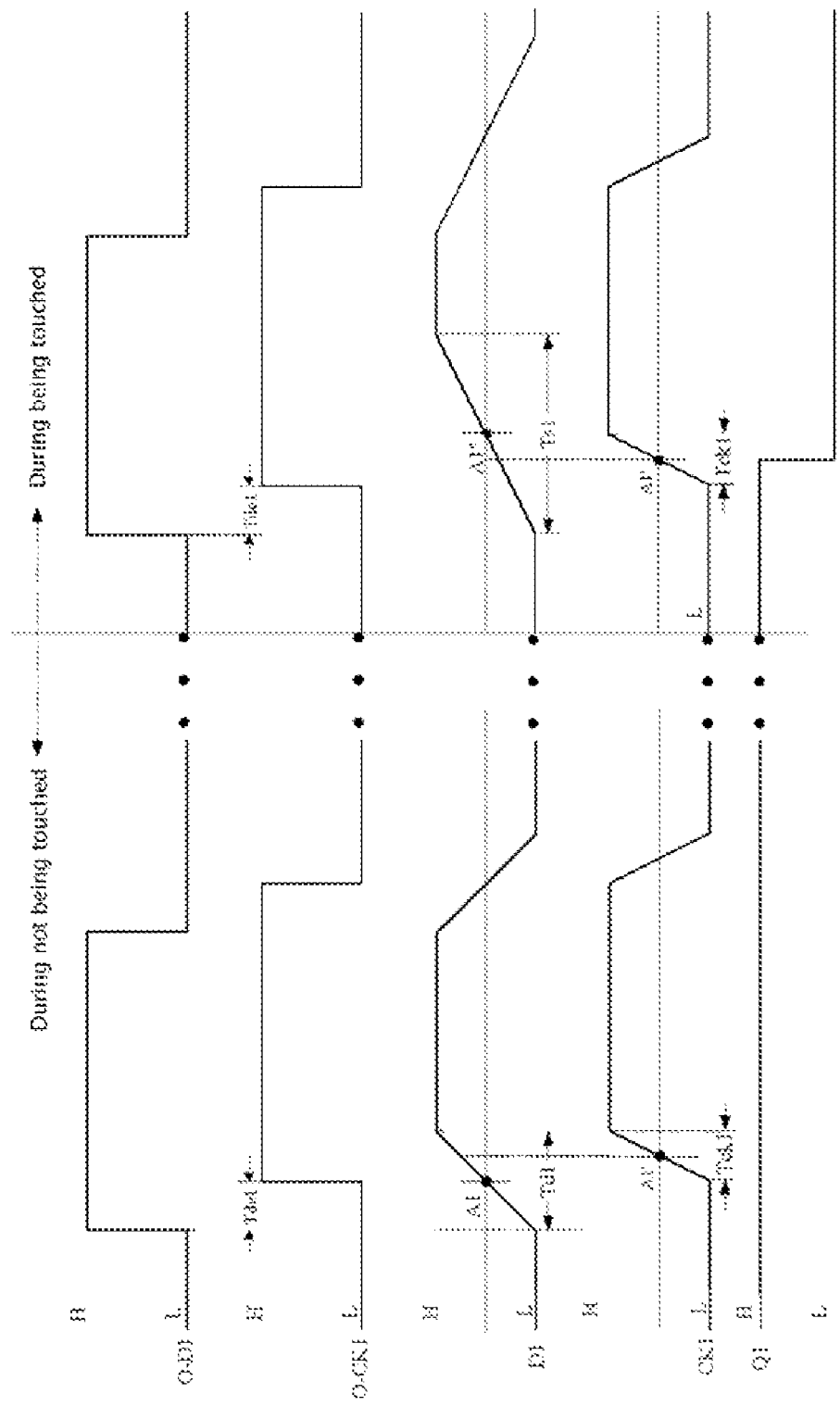
FIG. 2 is a signal diagram of input and output signals of a D-type flip-flop, when the sensor is touched/not touched by an electrical conducting object according to the FIG. 1.

FIG. 2 is a signal diagram of the input and output signals of the D-type flip-flop 16 when the sensor 13 is touched/not touched by the electrical conducting object according to FIG. 1. In FIG. 2, signal O-D1, O-CK1 respectively represents the AC signals outputting from the outputs O-D and O-CK. The rising edges of the signal O-D1 are a Tde1 time (Tde1>=0) ahead of the corresponding rising edges of the signal O-CK1. Signal D1 represents the D signal, and signal CK1 represents the CK signal. The D signal and the CK signal has a positive going time respectively indicated by Td1 and Tck1, when the sensor 13 is not touched. The D signal further has another positive going time indicated by Ts1 during the sensor 13 being touched. Ts1 is longer than Td1 due to the capacitance change of the second integration circuit. Line Vm represents a threshold voltage value and intersects respectively with the signals D1 and CK1 on a rising edge thereof when the sensor 13 is not touched, thus defining intersection points A1 and A1'. The intersection point A1 is a transition point of the D signal and the intersected point A1' is an active trigger point of the D-type flip-flop 16. The intersection point A1 is at a predetermined time ahead of the intersection point A1', and the D-type flip-flop 16 is therefore triggered to output an H signal indicated in signal Q2 at the intersection point A1'.

When the sensor 13 is touched by the electrical conducting object, the Line Vm intersects with the signal D1 at an intersection point A1". The intersection point A1" represents a transition point of the D signals during the sensor being touched. The intersection point A1' falls behind the intersection point A1' in timing, and as a result, at the intersection point A1', the D-type flip-flop 16 is triggered to output an L signal indicated in signal Q1.

Figure 3:
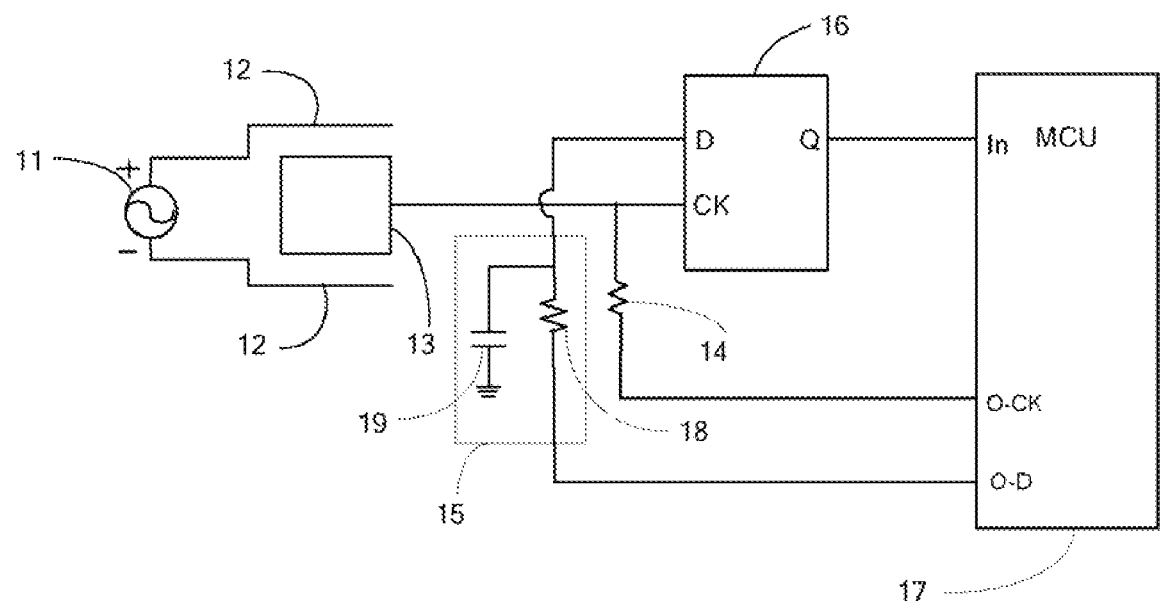
FIG. 3 is an exemplary circuit diagram of a touch sensing apparatus in accordance with a second preferred embodiment of the present invention.

FIG. 3 is an exemplary circuit diagram of a touch sensing apparatus in accordance with a second preferred embodiment of the present invention. As compared with FIG. 1, in this embodiment, the first integration circuit 15 is connected to the input D of the D-type flip-flop 16, and the second integration circuit is connected to the input CK of the D-type flip-flop 16. The first integration 15 delays the D signal to be inputted to the input D and the second circuit delays the CK signals to be inputted to the CK input.

Figure 4:
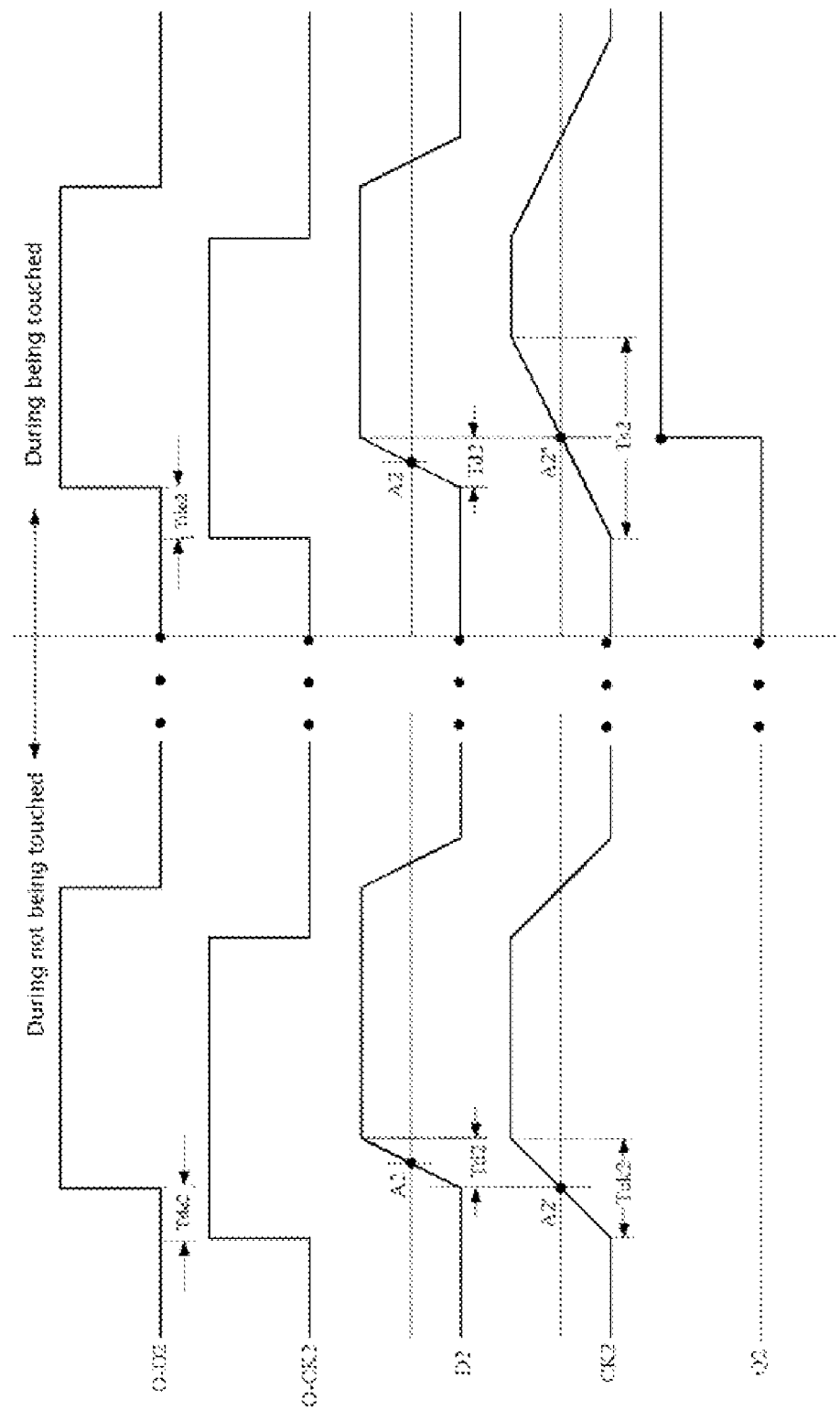
FIG. 4 is an signal diagrams of input and output signals of a D-type flip-flop, when a sensor is touched/not touched by an electrical conducting object according to the FIG. 3.

FIG. 4 is a signal diagrams of the input and output signals of the D-type flip-flop 16 during the sensor 13 is touched/not touched by the electrical conducting object according to the FIG. 3. Signal O-D2 and O-CK2 respectively represent the AC signals outputted from the outputs O-D and O-CK of the MCU 17. The rising edges of the signal O-D2 are a Tde2 time (Tde2>=0) behind of the corresponding rising edges of the signal O-CK2. Signal D2 represents the D signal, and signal CK2 represents the CK signal. The D signal and the CK signal have a positive going time respectively indicated by Td2 and Tck2, when the sensor 13 is not touched. The CK signal further has a positive going time that is indicated by Ts2 when the sensor 13 is touched. Ts2 is longer than Tck2 due to the capacitance change of the second integration circuit. Intersection points A2 and A2' between the line Vm with the signals D2 and CK2 respectively represent the transition point and the active trigger point of the D-type flip-flop 16 when the sensor is not touched. In this embodiment, the intersection point A2 falls behind in timing than the intersection point A2'. As a result, at the intersection A2', the D-type flip-flop 16 is triggered to output an L signal indicated in signal Q2.

When the sensor 13 is touched by the electrical conducting object, the line Vm intersects with the signal CK2 at an intersection point A2". The intersection point A2" represents the active trigger point of the CK signals when the sensor 13 is touched. The intersection point A2" falls behind the intersection point A2 in timing and as a result, at the intersection point A2", the D-type flip-flop 16 is triggered to output an H signal indicated in signal Q2.

Although the present invention has been specifically described on the basis of a preferred embodiment, the invention is not to be construed as being limited thereto. Various changes or modifications may be made to the embodiment without departing from the scope and spirit of the invention.

What is claimed is:

1. A touch sensing apparatus comprising:
    a flip-flop having a first input and a second input and an output;
    a sensor connected to the first input of the flip-flop and for receiving electricity signals from an object that touches the sensor;
    a microcontroller unit (MCU) having an input, a first output and a second output, the input for receiving and providing output signals of the flip-flop to the MCU to identify a touch on the sensor according to the output signals of the flip-flop, the first output for outputting a first AC signal to the first input of the flip-flop, and the second output for outputting a second AC signal to the second input of the flip-flop;
    an integration circuit interposed between the second input of the flip-flop and the second output of the MCU and for delaying the AC signal to be inputted to the second input of the flip-flop; and
    a resistor interposed between the first input of the flip-flop and the first output of the MCU;
    wherein:
    the flip-flop outputs a first type output signal at the output thereof when the sensor is not touched;
    the sensor receives electricity signals from the object, and causes a delay of the AC signal to be inputted to the first input of the flip-flop, the delay of the AC signal to be inputted to the first input of the flip-flop further causing the flip-flop to output a second type output signal at the output thereof; and
    the MCU detects an output change of the output signals of the flip-flop from the first type output signal to the second type output signal and accordingly identifies a touch on the sensor.

2. The touch sensing apparatus as described in claim 1, wherein the MCU is further provided for executing a predetermined task upon identifying the touch on the sensor.

3. The touch sensing apparatus as described in claim 1, wherein the flip-flop is a D-type flip-flop.

4. The touch sensing apparatus as described in claim 1, further comprising a differential signal source configured for generating a positive signal and a negative signal.

5. The touch sensing apparatus as described in claim 4, further comprising two conductors respectively connected to the positive signal output and the negative signal output of the differential signal source.

6. The touch sensing apparatus as described in claim 5, wherein the sensor locates between the two conductors and forms two simulated capacitors with the two conductors for offsetting environmental noise.

7. The touch sensing apparatus as described in claim 4, wherein the differential signal source is further provided for providing an alternating magnetic field for the touch sensing apparatus.

* * * * *